United States Patent [19]

Kawana

[11] Patent Number: 5,126,969
[45] Date of Patent: Jun. 30, 1992

[54] INTEGRATED CIRCUIT INCLUDING NON-VOLATILE MEMORY CELL CAPABLE OF TEMPORARILY HOLDING INFORMATION

[75] Inventor: Keiichi Kawana, Chiba, Japan

[73] Assignee: Kawasaki Steel Corporation, Hyogo, Japan

[21] Appl. No.: 563,193

[22] Filed: Aug. 6, 1990

[30] Foreign Application Priority Data

Aug. 9, 1989 [JP] Japan .................. 1-206396

[51] Int. Cl.$^5$ .............. G11C 7/00; G11C 14/00; G11C 16/04; G11C 16/06
[52] U.S. Cl. .................. 365/149; 365/185; 365/189.01; 365/201
[58] Field of Search ............ 365/185, 187, 149, 189.01, 365/230.01, 201

[56] References Cited

U.S. PATENT DOCUMENTS

| | | |
|---|---|---|
| 4,030,081 | 6/1977 | Horninger . |
| 4,112,510 | 9/1978 | Baker .................. 365/187 |
| 4,715,014 | 12/1987 | Tuvell et al. ......... 365/187 X |
| 4,788,663 | 11/1988 | Tanaka et al. . |
| 4,802,123 | 1/1989 | Tobita ................... 365/149 |
| 4,809,225 | 2/1989 | Dimmler ............. 365/149 X |
| 4,829,203 | 5/1989 | Ashmore, Jr. ........ 307/469 |
| 4,845,680 | 7/1989 | Iwahashi ............. 365/185 |
| 4,885,719 | 12/1989 | Brahmbhatt ....... 365/185 X |

FOREIGN PATENT DOCUMENTS 2300391 9/1976 France .

Primary Examiner—Alyssa H. Bowler
Attorney, Agent, or Firm—Oliff & Berridge

[57] ABSTRACT

There are provided, in addition to an ordinary operation word line for controlling a non-volatile memory upon regularly writing or reading information, a testing word line, a selection transistor, and a storage capacitor, whereby an input signal is transferred onto the testing word line upon inspection to switch on the selection transistor and hence the information is transferred into the capacitor through a bit line for writing into and reading from the capacitor. More specifically, the selection transistor and the capacitor are operated as in a DRAM to diagnose the function of an integrated circuit chip without operation of the non-volatile memory.

8 Claims, 2 Drawing Sheets

INTEGRATED CIRCUIT INCLUDING NON-VOLATILE MEMORY CELL CAPABLE OF TEMPORARILY HOLDING INFORMATION

BACKGROUND OF THE INVENTION

1. Field of the Invention

The present invention relates to an integrated circuit that includes a non-volatile memory cell capable of temporarily holding information and that is suitable for application to a programmable logic device (PLD).

2. Description of the Prior Art

PLDs sometimes include a non-volatile memory such as a PROM (programmable ROM) capable of erasing/rewriting any data with ultraviolet rays or an electric signal, namely, an EPROM (erasable PROM), an EEPROM (electrically erasable PROM), and the like.

Memory cell 8 in FIG. 3 illustrates such a circuit including an EPROM in a PLD.

In the FIG., $Tr_1$ is a floating gate transistor for nonvolatilely holding written information, $Tr_2$ is also a floating gate transistor sharing its gate with transistor $Tr_1$. 10 is a word line for selecting a row into and from which any information is written and read out, 12 is a bit line for transferring an input write/read signal of information, 14 is a resistor for supplying supply voltage Vdd to transistor $Tr_1$, 16 is a noise suppressing capacitor which is provided as needed, and 20 is an output line for transferring output programming data.

For writing information such as programming data into memory cell 8, a relatively high voltage is applied to word line 10 and bit line 12 to inject electric charges into the floating gate of transistor $Tr_2$. Additionally, for reading information, a relatively low read voltage is applied to word line 10 to cause a change in current flowing through the previously written transistor, $TR_2$, according to data written therein which transistor current change is in turn read through bit line 12 as the information stored in the transistor $Tr_1$.

In an integrated circuit such as a PLD which includes a memory cell such as memory cell 8; however, it is needed, after writing various information in the memory cell to diagnose operation of the same upon inspection of the integrated circuit chip, to erase written information in the memory cell by irradiating the chip with ultraviolet rays or inputting an electric signal into the same for each such inspection. Such erasing is a time-consuming and wasteful operation, e.g., it takes 20 minutes for every inspection of an EPROM. This obstructs mass-production without finding any countermeasure to solve it.

SUMMARY OF THE INVENTION

In view of the drawbacks with the prior art, it is an object of the present invention to provide an integrated circuit in which a non-volatile memory device included therein can be easily inspected in a short time.

To achieve the above object, an integrated circuit according to the present invention comprises a memory cell including a non-volatile mamory device for storing desired information, a word line, a switching element controlled by a potential of the word line to make and break conduction, a capacitor connectedd to an output terminal of said memory device, and means for switching on said switching element to make conduction when said memory device is not operated to accumulate electric charges on said capacitor for temporary holding of said information and for reading of the same thereafter.

The present inventor accumulated results of various investigations about how to eliminate much time and operation required for storing information in a non-volatile memory device and reading information from the same upon inspecting an integrated circuit chip including the non-volatile memory device such as an EPROM and the like. As a result, the inventor noticed that a dynamic RAM (DRAM) composed of a transistor and a capacitor, and the like would make it easy for information to be written thereinto in a short time, and hence intended to apply the function of such a DRAM to the present case.

For example, in an EPROM, there is provided first word line 10 for selection of a row and for writing information as shown in FIG. 3, and there is provided further, as shown in FIG. 1 for example, second word line 22 for testing, selection transistor 24 as a switching device and storage capacitor 26. Upon inspection, an input signal into second word line 22 is applied to switch on selection transistor 24, whereby desired information input such as programming data, etc., is transferred from bit line 12 and stored in capacitor 26, and thereafter available and read through output line 20. More specifically, selection transistor 24 and capacitor 26 are operated as in a DRAM, so that the function of an integrated circuit chip, such as a PLD, is diagnosed without operation of a non-volatile memory device. Thus, integrated circuits, each including a non-volatile memory cell can be easily inspected in a short time, and mass-produced.

Herein, capacitor 26 has a time constant between it and resistor 14 to keep electric charges for several tens of milliseconds and hence permit the function of an integrated circuit to be diagnosed during that time. Additionally, capacitor 26 can be available to serve the same purposes as a capacitor which has previously been provided on the output side of the storage transistor $Tr_1$, that is to say for noise suppression. Thereby, effective use of the device is attained by improving the degree of integration.

BRIEF DESCRIPTION OF THE DRAWINGS

The preferred embodiments will be described with reference to the drawings, wherein like elements have been denoted throughout the figures with like reference numerals, and wherein.

DESCRIPTION OF THE PREFERRED EMBODIMENTS

In what follows, embodiments of the present invention will be described with reference to the accompanying drawings.

Figure 1:
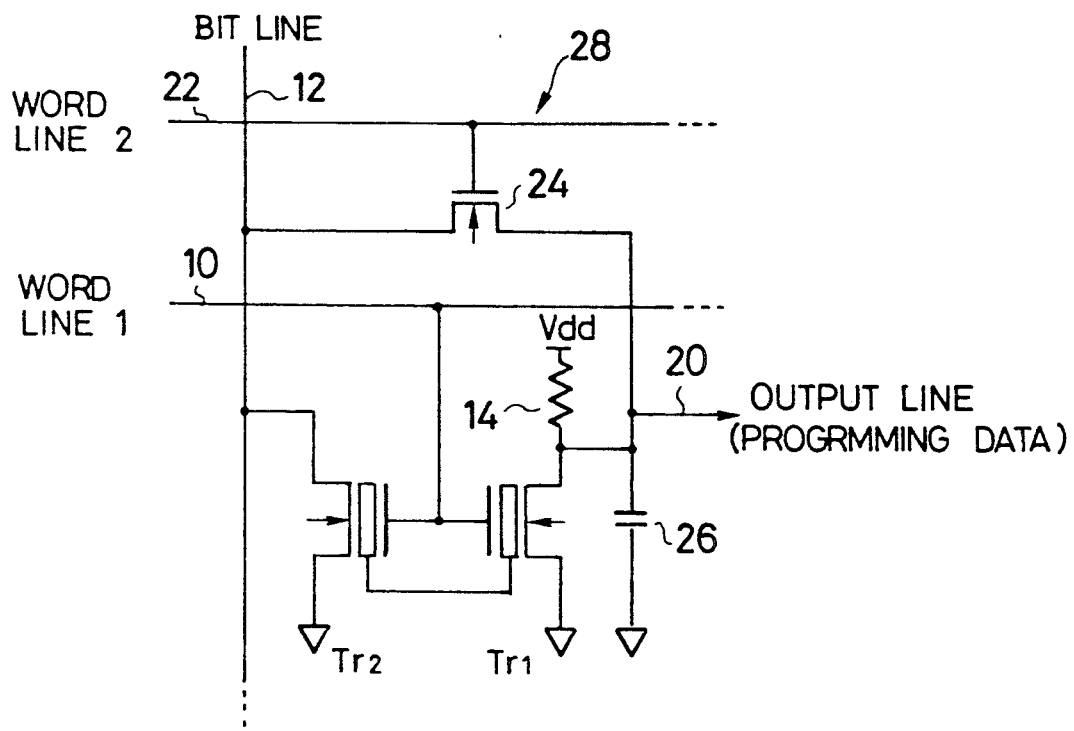
FIG. 1 is a circuit diagram illustrating the construction of a memory cell of a PLD according to a first embodiment of the present invention.
Figure 3:
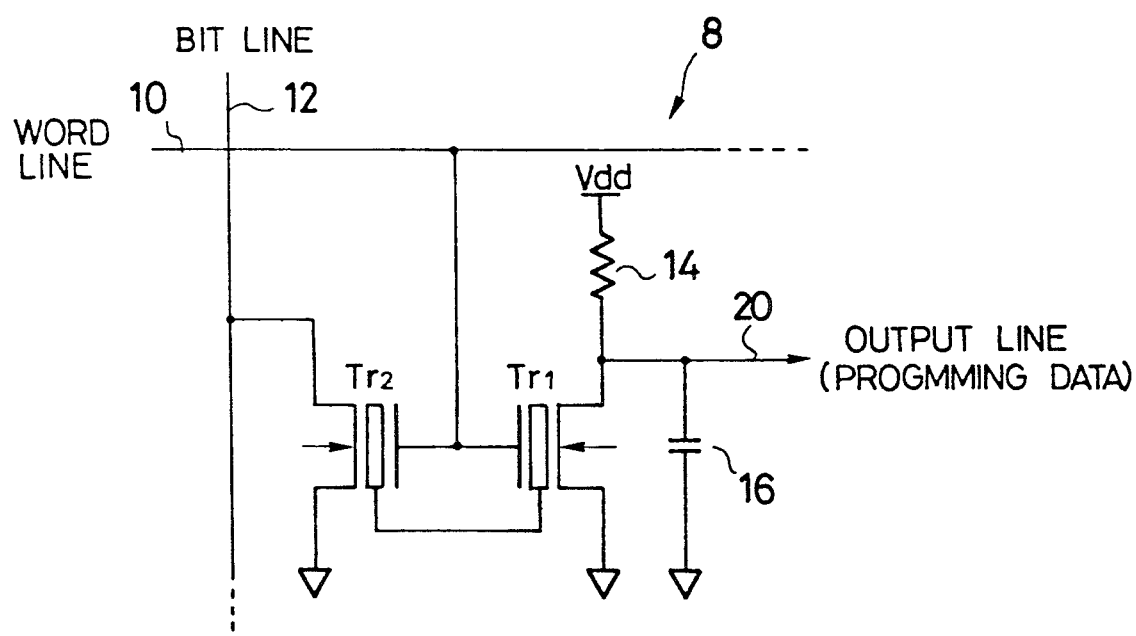
FIG. 3 is a circuit diagram illustrating the construction of a prior PLD memory cell.

In a first embodiment, in a PLD for example, there is provided, as illustrated in FIG. 1, memory cell 28 which includes, in addition to the elements of memory cell 8 shown in FIG. 3, second word line 22 for testing selection transistor 24 as a switching device, and information holding capacitor 26 for DRAM operation also serving as a noise suppressing capacitor. Further, additional construction is similar to that of memory cell 8 of FIG. 3, and hence the like elements will be denoted with the like reference numeral and the description thereof will be omitted.

For inspection of a PLD including memory cell 28 according to the first embodiment, a signal is first applied to the second word line 22 to switch on selection transistor 24. Then, a siganl voltage input is applied to bit line 12 to store programming data on the capacitor 26. At this time, original word ine 10 is made off (no signal input) to prevent transistor $Tr_1$ from being read.

In operation, the data written in capacitor 26 is read through output line 20 with the same operation as in the DRAM. Capacitor 26 can store electric charges over several tens of milliseconds for example, owing to the time constant defined between it and resistor 14, permitting the function of the memory cell to be diagnosed during that time. Resistor 14 may be provided with resistance from several hundreds of gigaohms (GΩ) to several teraohms (TΩ), which increases the RC time constant by reducing the leakage of the electric charges and assuring increased read time.

Figure 2:
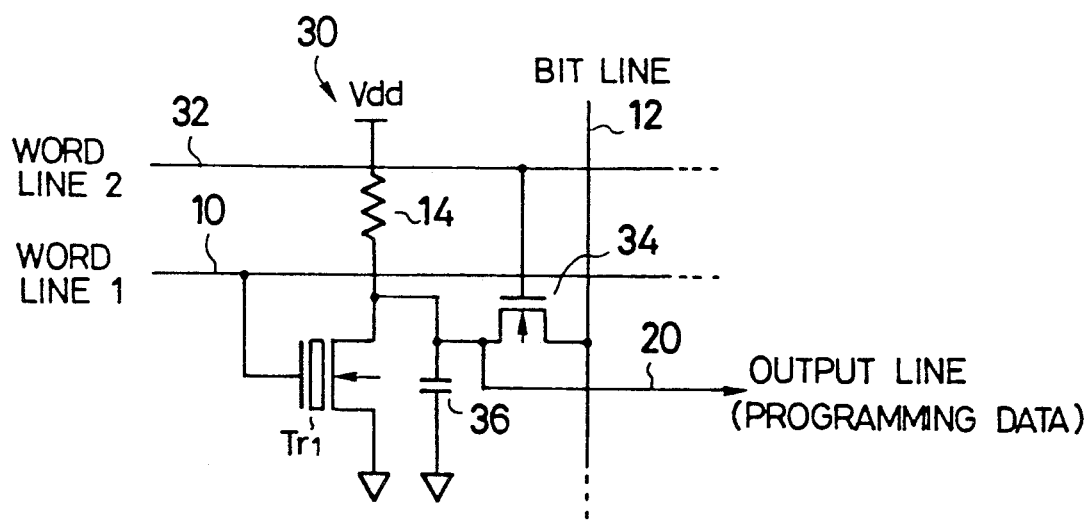
FIG. 2 is a circuit diagram illustrating the construction of a memory cell of a PLD according to a second embodiment of the present invention.

In a second embodiment, in a PLD for example, there is provided, as illustrated in FIG. 2, memory cell 30 which includes, in addition to floating gate transistor $Tr_1$ for holding written information, first word line 10 for selecting a row where information is written and read, bit line 12 for transferring an input write/read signal of information, and resistor 14 through which supply voltage Vdd is applied to transistor $Tr_1$, second word line 32 for testing, selection transistor 34, and information holding capacitor 36 for DRAM operation also serving as a noise suppressing capacitor.

For inspecting a PLD chip including memory cell 30, as in the first embodiment, selection transistor 34 and capacitor 36 are operable as in the DRAM, and information is written and read respectively through bit line 12 and output line 20 to diagnose.

Also in the second embodiment, a PLD can be inspected without the need for writing and reading any information into and from transistor $Tr_1$, and hence without requiring much time and elaborate operation for the inspection.

Herein, although in the first and second embodiments the memory cells of circuit construction shown in FIGS. 1 and 2 were exemplarily illustrated, circuit construction for realizing the present invention is not limited thereto. For example, the invention may be applicable to an integrated circuit including an EEPROM as a non-volatile memory.

What is claimed is:

1. An integrated circuit including a non-volatile memory cell having a bit line and an output line, the non-volatile memory cell comprising:
   a non-volatile memory device connected to the output line for permanently storing desired information;
   a first word line connected to said non-volatile memory device;
   capacitor means connected to the output line for temporarily storing information;
   a switching device connected between the output line and the bit line;
   a second word line connected to said switching device so that said second word line selectively causes the bit line to communicate with the output line.

2. The integrated circuit of claim 1, wherein said capacitor means for temporarily storing information comprises a resistor connected in series with a capacitor, said resistor supplying voltage to said non-volatile memory device.

3. The integrated circuit of claim 1, wherein said non-volatile memory device comprises a pair of floating gate transistors, said pair sharing a gate with each other.

4. The integrated circuit of claim 1, wherein said non-volatile memory device comprises a single floating gate transistor.

5. The integrated circuit of claim 1, wherein said switching device comprises a selection transistor.

6. The integrated circuit of claim 1, wherein said second word line selectively causes information on the bit line to be transferred to the output line, a signal containing the information being temporarily stored in said capacitor means for temporarily storing information.

7. The integrated circuit of claim 6, wherein said first word line renders inoperable an operation of the non-volatile memory device when said second word line selectively causes information on the bit line to be transferred to the output line.

8. The integrated circuit of claim 1, wherein said capacitor means for temporarily storing information comprises means for noise suppression.

* * * * *